United States Patent
Lin et al.

(10) Patent No.: US 8,592,300 B2
(45) Date of Patent: Nov. 26, 2013

(54) INTERFACE STRUCTURE FOR COPPER-COPPER PEELING INTEGRITY

(71) Applicant: Taiwan Semiconductor Manufacturing Company, Ltd., Hsin-Chu (TW)

(72) Inventors: Cheng-Chung Lin, Taipei (TW); Chung-Sui Liu, Shin-Chu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/728,833

(22) Filed: Dec. 27, 2012

(65) Prior Publication Data

US 2013/0149856 A1    Jun. 13, 2013

Related U.S. Application Data

(62) Division of application No. 12/633,499, filed on Dec. 8, 2009, now Pat. No. 8,344,506.

(51) Int. Cl.
*H01L 23/50* (2006.01)

(52) U.S. Cl.
USPC .................... 438/613; 438/614; 257/E23.079

(58) Field of Classification Search
USPC .......... 257/737, 738, 778, E23.079; 438/613, 438/614
See application file for complete search history.

(56) References Cited

U.S. PATENT DOCUMENTS

| | | |
|---|---|---|
| 6,333,120 B1 | 12/2001 | DeHaven et al. |
| 6,572,982 B1 | 6/2003 | Uzoh et al. |
| 6,649,507 B1 | 11/2003 | Chen et al. |
| 2004/0157450 A1* | 8/2004 | Bojkov et al. ................. 438/689 |
| 2011/0133331 A1 | 6/2011 | Lin |

* cited by examiner

*Primary Examiner* — Roy Potter
(74) *Attorney, Agent, or Firm* — Haynes and Boone, LLP

(57) ABSTRACT

An integrated circuit device is disclosed. An exemplary integrated circuit device includes a first copper layer, a second copper layer, and an interface between the first and second copper layers. The interface includes a flat zone interface region and an intergrowth interface region, wherein the flat zone interface region is less than or equal to 50% of the interface.

20 Claims, 4 Drawing Sheets

INTERFACE STRUCTURE FOR COPPER-COPPER PEELING INTEGRITY

PRIORITY DATA

The present application is a divisional application of U.S. patent application Ser. No. 12/633,499, filed Dec. 8, 2009, which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Integrated circuit devices comprise a multitude of material layers, each material layer meeting another material layer at an interface. The interface may be subjected to various processing and manufacturing steps and preferably maintains interface integrity throughout manufacture of the integrated circuit device. For example, it is desired that each interface maintain peeling integrity (i.e., the two layers do not peel away from one another, which can sometimes form a void). It has been observed that conventional interfaces, particularly copper-copper interfaces (such as an interface between two copper layers) exhibit peeling, which degrades overall integrated circuit device performance. A need therefore exists to provide an interface structure for addressing interface peeling issues.

SUMMARY

The present disclosure provides for many different embodiments. An exemplary integrated circuit device can include a first copper layer, a second copper layer disposed over the first copper layer, and an interface between the first and second copper layers. The interface includes a flat zone interface region and an intergrowth interface region, wherein the flat zone interface region is less than or equal to 50% of the interface.

Another exemplary integrated circuit device can include a semiconductor substrate comprising a bonding pad; a bump structure overlying the semiconductor substrate and electrically connected to the bonding pad; and a copper seed layer disposed between the bonding pad of the substrate and the bump structure. An interface between the bump structure and the copper seed layer may be free of a copper oxide layer.

An exemplary method of forming an integrated circuit device can include providing a substrate having a bonding pad; forming a copper seed layer over the bonding pad; performing a descumming process that utilizes a $CF_4/O_2/N_2$ plasma; removing a residual layer formed over the copper seed layer during the descumming process; and thereafter, forming a bump structure over the copper seed layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
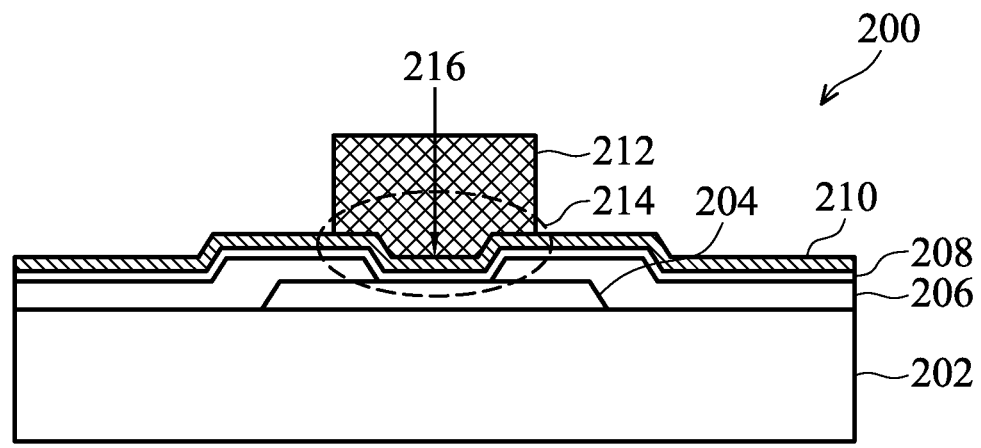
FIG. 1A is a cross-sectional view of an embodiment of an integrated circuit device according to aspects of the present disclosure.

The present disclosure relates generally to integrated circuit devices, and more particularly, to integrated circuit device interfaces.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Integrated circuit devices comprise a multitude of material layers, each material layer meeting another material layer at an interface. The interface may be subjected to various processing and manufacturing steps and preferably maintains interface integrity throughout manufacture of the integrated circuit device. For example, it is desired that each interface maintain peeling integrity (i.e., the two layers do not peel away from one another, which can sometimes form a void). Conventional interfaces, particularly copper-copper interfaces (such as an interface between a copper seed layer and a copper layer (e.g., a copper layer formed by an electrochemical plating process)) exhibit peeling, which degrades overall integrated circuit device performance.

The present disclosure defines interface criterion for eliminating interface peeling, particularly in a copper-copper interface. The embodiments discussed below will describe the interface criterion with reference to a copper-copper interface between a copper interconnect post (i.e., a bump structure used for packaging integrated circuit devices) and an underlying copper seed layer. The embodiment is merely intended as an example, and it is understood that the interface criterion described herein applies to any interface, particularly any copper-copper interface, which may appear in an integrated circuit device, or portion thereof. For example, the interface criterion may be applied to a copper interconnect structure.

Referring to FIG. 1A, an integrated circuit device 200 (alternatively referred to as a semiconductor device) is provided having various material layer interfaces. One of the material interfaces is a copper-copper interface, which will be further described below. It is understood that additional features can be added in the integrated circuit device 200, and some of the features described below can be replaced or eliminated, for additional embodiments of the integrated circuit device 200.

The integrated circuit device 200 includes a substrate 202 having microelectronic elements formed therein. The substrate 202 is a semiconductor substrate comprising silicon. Alternatively, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer.

The substrate 202 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 202, in a P-well structure, in a N-well structure, in a dual-well structure, or using a raised structure. The substrate 202 may further include various active regions, such as regions configured for an N-type metal-oxide-semiconductor (NMOS) transistor device and regions configured for a P-type metal-oxide-semiconductor (PMOS) transistor device.

The substrate 202 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 202 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and/or other suitable types of devices.

The integrated circuit device 200 may further include an interconnect structure formed over the substrate 202. For example, the interconnect structure can include inter-layer dielectric (ILD) layers, inter-metal dielectric (IMD) layers, and metallization layers. The ILD and/or IMD layers in the interconnect structure include low-k dielectric materials, un-doped silicate glass (USG), silicon nitride, silicon oxynitride, other suitable materials, and/or combinations thereof. The dielectric constants (k value) of the low-k dielectric materials may be less than about 3.9, or less than about 2.8. The metallization layers may form metal lines in the interconnect structure, which may be formed of copper, copper alloys, and/or other suitable materials. One skilled in the art will realize the formation details of the interconnect structure that may be included over the substrate 202.

The substrate 202 further includes a bonding pad 204. The bonding pad 204 is a top metallization layer formed in a top-level inter-layer dielectric layer, which can be a portion of a conductive route. The bonding pad 204 may have an exposed surface treated by a planarization process, such as a chemical mechanical polishing (CMP) process, if necessary. Suitable materials for the bonding pad 204 include, but are not limited to, copper, aluminum, copper alloy, silver, gold, nickel, tungsten, mobile conductive materials, alloys thereof, multi-layers thereof, other suitable materials, and/or combinations thereof. The profile of the bonding pad 204 may have any suitable step height in order to achieve adequate bonding properties.

A passivation layer 206 is provided on the substrate 202 and patterned to expose a portion of the bonding pad 204. The passivation layer 206 may be formed of any suitable material, for example, a non-organic material including un-doped silicate glass (USG), silicon nitride, silicon oxynitride, silicon oxide, other suitable materials, and/or combinations thereof. Alternatively, the passivation layer 206 may be formed of a polymer layer, such as an epoxy, polyimide, benzocyclobutene (BCB), polybenzoxazole (PBO), other suitable materials, and/or combinations thereof.

A diffusion barrier layer 208 and a seed layer 210 is formed over the passivation layer 206 and exposed portion of the bonding pad 204. It is contemplated that additional layers may be included over the passivation layer. The diffusion barrier layer 208 may also be referred to as a conductive glue layer. The diffusion barrier layer 208 is formed of any suitable material, for example, titanium, titanium nitride, tantalum, tantalum nitride, other suitable barrier layer materials, and/or combinations thereof. The diffusion barrier layer 208 is formed by any suitable process, such as physical vapor deposition or sputtering.

The seed layer 210 is also formed of any suitable material. In the present embodiment, the seed layer 210 is a copper seed layer. The seed layer 210 may be formed of copper alloys that include silver, chromium, nickel, tin, gold, and/or other suitable materials. The seed layer 210 is formed by any suitable process, such as physical vapor deposition or sputtering. The seed layer 210 may also be referred to as a first copper layer.

A bump structure 212 is formed over the substrate 202. As illustrated in FIG. 1A, the bump structure 212 is formed over the exposed portion of the bonding pad 204. In the present embodiment, the bump structure 212 is an interconnect post. The bump structure 212 may be a flip-chip assembly, which provides direct electrical connection of a face-down integrated circuit device (i.e., integrated circuit device 200) onto another substrate, such as a board or printed circuit board (PCB). It is understood that the UBM layer including the diffusion barrier layer 208 and seed layer 210 may also be considered part of the bump structure. The bump structure 212 may further include a solder layer formed on the interconnect post. The solder layer comprises any suitable material, such as Sn, SnAg, Sn—Pb, SnAgZn, SnZn, SnBi—In, Sn—In, Sn—Au, SnPb, SnCu, SnZnIn, and/or SnAgSb.

The bump structure 212 comprises any suitable material. In the present example, the interconnect post is a metal post, which may be formed of a conductive material with solder wettability. For example, the bump structure 212 is formed of copper, which is referred to as a copper post, copper bump, and/or copper pillar. The copper post is also referred to as a plated copper layer and/or second copper layer. The copper post (or copper pillar) is formed by any suitable process, such as an electrochemical plating (ECP) process.

The integrated circuit device 200 includes various interfaces between the various layers. For example, integrated circuit device 200 includes a substrate 202/bonding pad 204 interface, a substrate 202/passivation layer 206 interface, a bonding pad 204/passivation layer 206 interface, a bonding pad 204/diffusion barrier layer 208 interface, a passivation layer 206/diffusion barrier layer 208 interface, a diffusion barrier layer 208/seed layer 210 interface, and a seed layer 210/bump structure 212 interface. The interfaces maintain integrity during and throughout fabrication of the integrated circuit device 200, such that device performance is not degraded by interface issues, such as peeling.

Figure 1B:
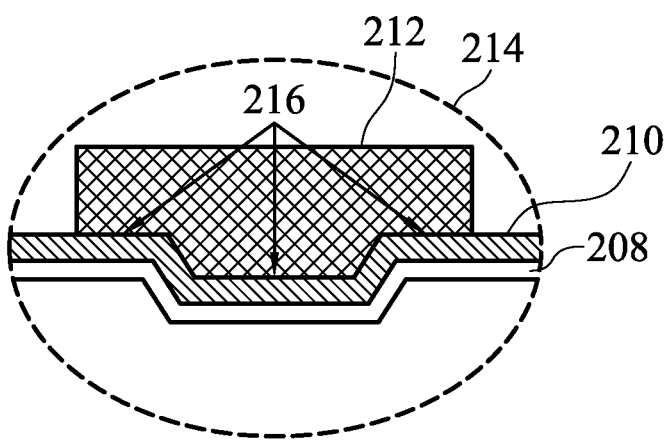
FIG. 1B is an enlarged cross-sectional view of an interface between two material layers of the integrated circuit device illustrated in FIG. 1A.

A portion 214 of the integrated circuit device 200 designates an interface 216 between the seed layer 210 and the bump structure 212 (the seed layer 210/bump structure 212 interface). More particularly, in the present embodiment, portion 214 of the integrated circuit device 200 designates an interface between copper seed layer 210 and ECP copper pillar/layer (or bump structure) 212 (alternatively referred to as a interface between a first copper layer and a second copper layer). FIG. 1B provides an enlarged view of the portion 214 designating the interface 216 between the two material layers. The copper seed layer 210 and ECP copper post/layer (or bump structure 212) meet at numerous locations.

As noted above, it has been observed that interfaces, particularly copper-copper interfaces, can suffer from peeling issues. This can degrade device performance. Accordingly, the present disclosure provides interface criterion for preventing such peeling issues arising at interface 216. Again, it is noted that the described interface 216 between the copper seed layer 210 and ECP copper post/layer (or bump structure) 212 is provided merely for example and is in no way intended to be limiting. The interface criterion applies equally to any interface, particularly copper-copper interfaces.

Figure 2A:
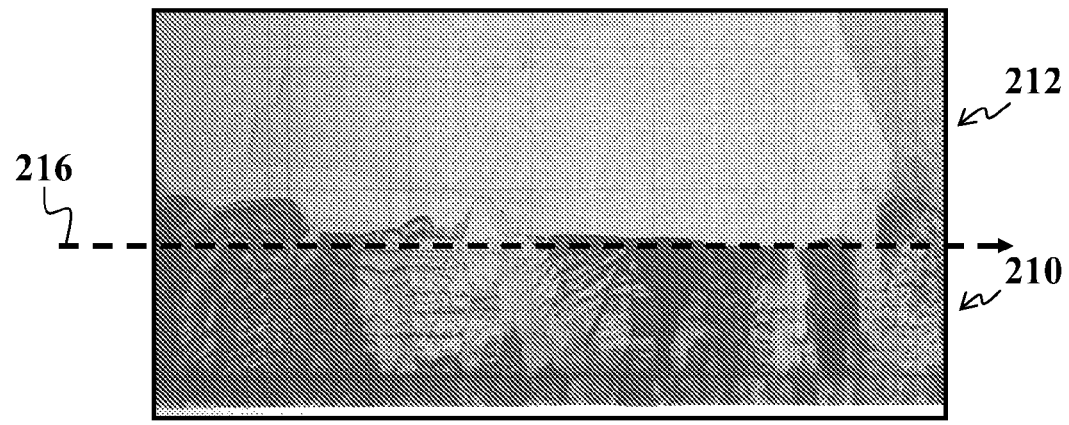
FIGS. 2A-2B are cross-sectional views of embodiments of an interface between two material layers of an integrated circuit device.
Figure 2B:
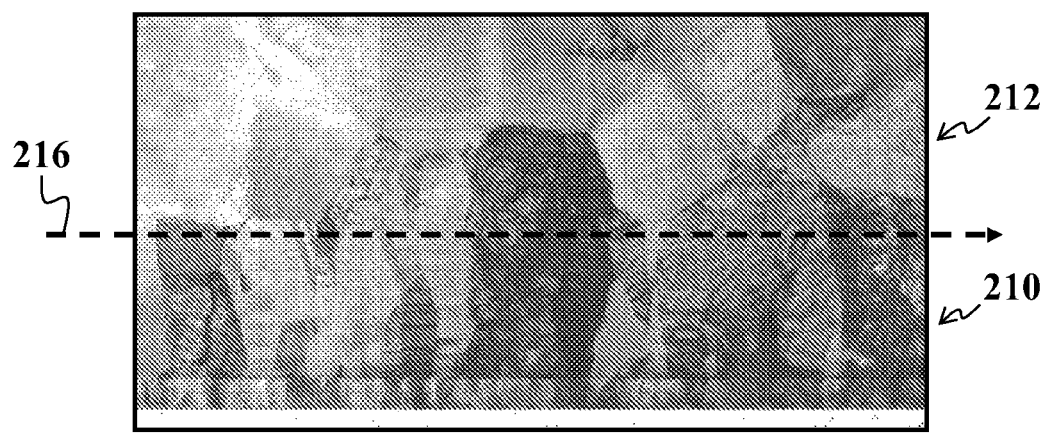

Referring to FIGS. 2A and 2B, embodiments of an interface 216 between copper seed layer 210 (an underlying copper layer) and ECP copper pillar/layer (or bump structure) 212 (a post-deposited copper layer) in various states are illustrated. FIG. 2A illustrates a flat zone interface between the underlying copper layer and post-deposited copper layer, where very little to no intergrowth between the layers 210, 212 is exhibited, and the layers 210, 212 are easily delineated from one another. Conventional interfaces exhibit such characteristics. FIG. 2B illustrates an intergrowth interface between the underlying copper layer and post-deposited copper layer, where substantial intergrowth between the layers 210, 212 is exhibited, and layers 210, 212 are not easily delineated from one another.

The present disclosure proposes having the interface 216 comprise a combination of flat zone interface regions and intergrowth interface regions. More particularly, having less than 50% of the interface 216 exhibit flat zone interface regions reduces (and essentially eliminates) peeling issues. Interfaces where the flat zone interface region is greater than 50% of the interface still suffer from peeling issues. The intergrowth interface regions are areas where the layers at the interface are intertwined, or have experienced inter-grain growth. The intergrowth interface region may be achieved by various processes, for example, any suitable annealing or cleaning process.

It should be noted that during fabrication of integrated circuit device 200, before the ECP copper pillar/layer (or bump structure) 212 is deposited over the copper seed layer 210 (an underlying copper layer), a cleaning (i.e., descum) process is typically performed to remove residues from the surface of the copper seed layer 210. The descumming process may utilize a $CF_4/O_2/N_2$ plasma. It has been observed that a residual layer, such as a copper oxide ($CuO_x$) and/or copper fluoride ($CuF_x$) layer, may form over the copper seed layer 210 after the descumming process. Accordingly, when the ECP copper pillar/layer 212 is deposited over the copper seed layer 210, a $CuO_x/CuF_x$ layer is between the copper layers 210, 212, preventing (or hindering) intergrowth between the copper layers 210, 212. Thus, the resulting interface between the copper layers 210, 212 exhibits peeling. This peeling can result because the flat zone interface regions comprise greater than 50% of the interface when the $CuO_x/CuF_x$ layer is present. To achieve an interface with fewer flat zone interface regions (particularly flat zone interface regions less than 50% of the interface), the interface is formed free of a copper oxide and/or copper fluoride layer. Any suitable process is utilized to remove (or eliminate) the $CuO_x/CuF_x$ layer. The interface free of the $CuO_x/CuF_x$ layer facilitates inter-grain intergrowth between the copper layers.

Figure 3A:
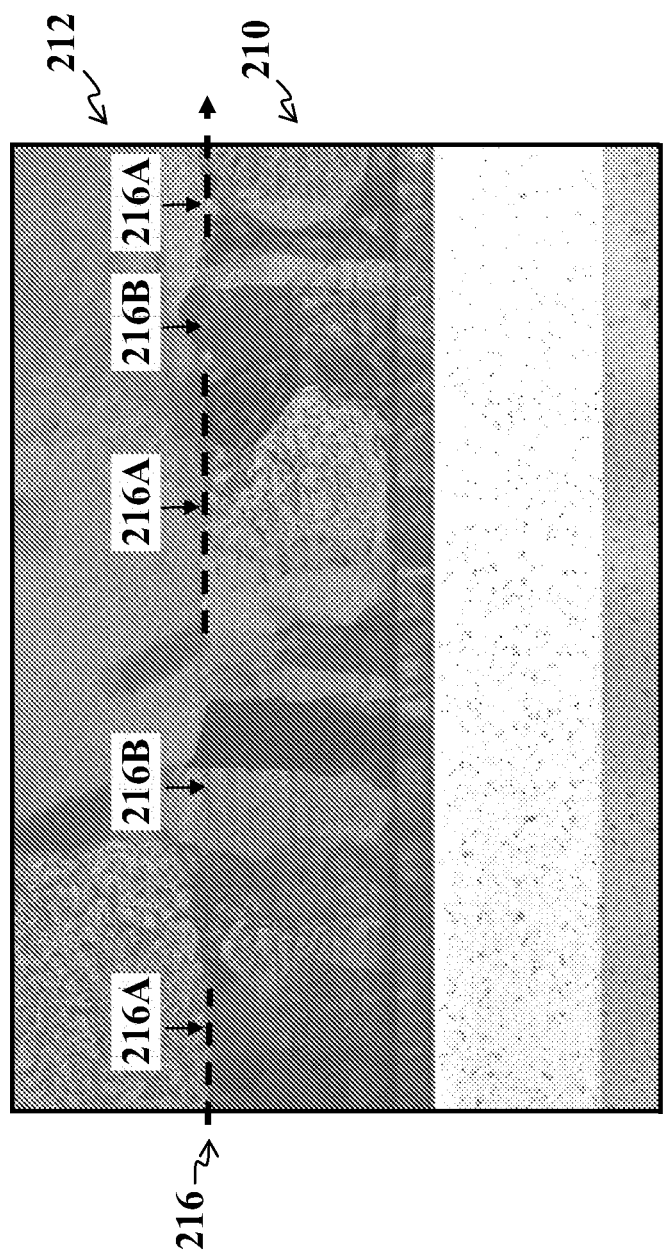
FIGS. 3A-3B are cross-sectional views of embodiments of an interface between two material layers of an integrated circuit device.
Figure 3B:
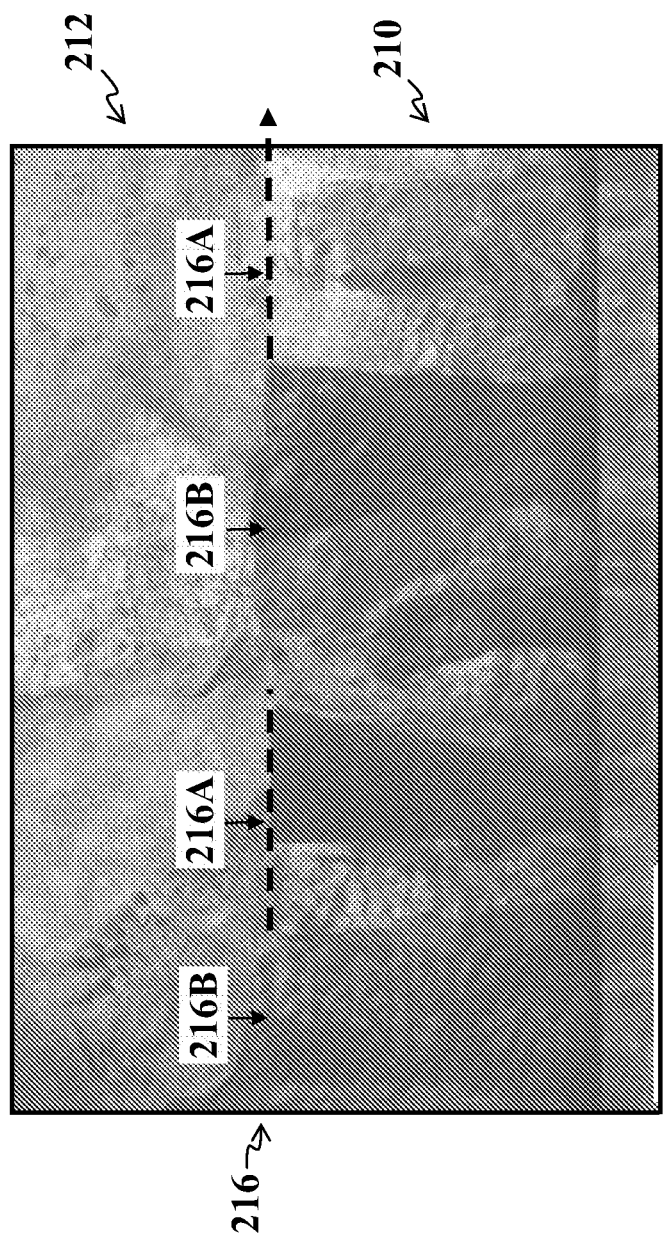

Referring to FIGS. 3A and 3B, embodiments of the interface 216 between copper seed layer 210 (underlying copper layer) and ECP copper pillar/layer (or bump structure) 212 (post-deposited copper layer) having flat zone interface regions less than or equal to 50% of the interface 216 are illustrated. FIGS. 3A and 3B illustrate the interface 216 having flat zone interface regions 216A and intergrowth interface regions 216B. The flat zone interface regions 216A between the underlying copper layer and post-deposited copper layer exhibit virtually no to little intergrowth between the layers 210, 212, and the layers 210, 212 are easily delineated from one another. The intergrowth interface regions 216B between the underlying copper layer and post-deposited copper layer exhibit substantial intergrowth between the layers 210, 212, and layers 210, 212 are not easily delineated from one another. From FIGS. 3A and 3B, the interface 216 exhibits a length, wherein less than or equal to 50% of the interface's length exhibits flat zone interface regions. FIG. 3A exhibits the interface 216 having flat zone interface regions 216A comprising approximately 50% of the interface 216, and FIG. 3B exhibits the interface 216 having flat zone interface regions 216A comprising less than 50% of the interface 216, for example, approximately 46.6% of the interface 216. Having the flat zone interface regions 216A less than or equal to approximately 50% of the interface 216 eliminates peeling issues at the interface 216 (i.e., the copper-copper interface). Reducing (or eliminating peeling issues) provides improved overall device performance. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device comprising:

providing a substrate having a bonding pad;
forming a copper seed layer over the bonding pad;
performing a descumming process that utilizes a $CF_4/O_2/N_2$ plasma;
removing a residual layer formed over the copper seed layer during the descumming process; and
thereafter, forming a bump structure over the copper seed layer.

2. The method of claim 1 wherein an interface between the bump structure and the copper seed layer is free of a copper oxide layer.

3. The method of claim 1 wherein an interface between the bump structure and the copper seed layer is free of a copper fluoride layer.

4. The method of claim 1 wherein an interface between the bump structure and the copper seed layer includes a flat zone interface region and an intergrowth interface region, the flat zone interface region being less than or equal to 50% of the interface.

5. The method of claim 1 wherein forming the bump structure over the copper seed layer comprises forming a copper pillar on the copper seed layer.

6. The method of claim 1 wherein forming the bump structure over the copper seed layer comprises:
forming a copper pillar on the copper seed layer; and
forming a solder layer on the copper pillar.

7. A method comprising:
forming a first copper layer over a substrate; and
forming a second copper layer over the first copper layer, wherein an interface between the first copper layer and the second copper layer comprises a flat zone interface region and an intergrowth interface region, wherein the flat zone interface region is less than or equal to 50% of the interface.

8. The method of claim 7, further comprising cleaning the first copper layer to remove residue from a surface of the first copper layer.

9. The method of claim 8, wherein cleaning the first copper layer to remove residue from the surface of the first copper layer is performed prior to forming the second copper layer over the first copper layer.

10. The method of claim 8, wherein cleaning the first copper layer to remove residue from the surface of the first copper layer includes performing a plasma cleaning process.

11. The method of claim 7, wherein the first copper layer includes a seed layer and the second copper layer includes a bump structure.

12. The method of claim 7, wherein the flat zone interface region includes a first flat zone interface region and a second flat zone interface region, wherein the intergrowth interface region is disposed between the first flat zone interface region and the second flat zone interface region.

13. The method of claim 7, wherein the flat zone interface region comprises a portion of the interface where the first copper layer physically contacts the second copper layer and exhibits little to no intergrowth, and
wherein the intergrowth interface region comprises a portion of the interface where the first copper layer physically contacts the second copper layer and exhibits intergrain growth.

14. The method of claim 7, wherein the first copper layer and the second copper layer are electrically coupled.

15. A method comprising:
forming a bonding pad over a semiconductor substrate;
forming a copper seed layer over the bonding pad substrate; and
forming a bump structure over the copper seed layer, wherein an interface between the bump structure and the copper seed layer is free of copper oxide, wherein the interface includes a flat zone interface region and an intergrowth interface region, the flat zone interface region being less than or equal to 50% of the interface.

16. The method of claim 15, further comprising performing a cleaning process on the copper seed layer to remove residue therefrom prior to forming the bump structure over the copper seed layer.

17. The method of claim 15, wherein the bump structure is electrically coupled to the bonding pad.

18. The method of claim 15, wherein the bump structure is formed of a material that includes copper.

19. The method of claim 15 wherein a portion of the bump structure physically contacts a portion of the copper seed layer.

20. The method of claim 15, further comprising:
performing a descumming process that utilizes a $CF_4/O_2/N_2$ plasma; and
removing a residual layer formed over the copper seed layer during the descumming process.

* * * * *